(12) United States Patent
Lesea

(10) Patent No.: US 6,915,503 B1
(45) Date of Patent: Jul. 5, 2005

(54) METHODS OF UTILIZING NOISE CORES IN PLD DESIGNS TO FACILITATE FUTURE DESIGN MODIFICATIONS

(75) Inventor: Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 155 days.

(21) Appl. No.: 10/323,292

(22) Filed: Dec. 17, 2002

(51) Int. Cl.[7] ............................................. G06F 17/50
(52) U.S. Cl. ................................... 716/16; 716/17
(58) Field of Search ......................... 716/4–6, 12–17; 714/738–744; 710/3–4

(56) References Cited

U.S. PATENT DOCUMENTS

| | | | | |
|---|---|---|---|---|
| 4,893,311 A | * | 1/1990 | Hunter et al. .................. 714/733 |
| 5,668,507 A | * | 9/1997 | Boerstler et al. ............... 331/78 |
| 5,732,246 A | * | 3/1998 | Gould et al. .................... 716/16 |
| 6,360,283 B1 | * | 3/2002 | Houldsworth .................... 710/3 |
| 6,496,044 B1 | * | 12/2002 | Nguyen et al. .................. 327/108 |
| 6,532,579 B2 | * | 3/2003 | Sato et al. ...................... 716/8 |
| 2002/0120898 A1 | * | 8/2002 | Chen et al. ..................... 714/739 |
| 2002/0157071 A1 | * | 10/2002 | Schiefele et al. ............... 716/6 |
| 2003/0177427 A1 | * | 9/2003 | Fattouh et al. ................. 714/741 |

* cited by examiner

Primary Examiner—Vuthe Siek
Assistant Examiner—Naum Levin
(74) Attorney, Agent, or Firm—Lois D. Cartier; LeRoy D. Maunu

(57) ABSTRACT

Methods of using "noise cores" in a PLD design. "Noise cores" are pre-developed blocks of logic included in a PLD design for the purpose of creating noise in other circuits also implemented in the PLD. By gradually increasing the level of noise created by the noise core, the noise sensitivity of the user circuit can be determined. Also, by ensuring that the user circuit functions properly when combined with the noise core, a designer can have confidence that unmodified portions of the user circuit will still function properly when the user circuit is modified. In some embodiments, once the user circuit has been qualified with the noise core operational, the noise core is disabled prior to including the PLD design in a system. Because the user circuit is proven to withstand a certain level of noise, future additions to the design do not necessarily require re-qualification of the user circuit.

35 Claims, 7 Drawing Sheets

METHODS OF UTILIZING NOISE CORES IN PLD DESIGNS TO FACILITATE FUTURE DESIGN MODIFICATIONS

FIELD OF THE INVENTION

The invention relates to programmable logic devices (PLDs). More particularly, the invention relates to cores for a PLD designed for the purpose of creating noise in other circuits implemented in the PLD with the cores, and methods of utilizing such cores to facilitate future design modifications.

BACKGROUND OF THE INVENTION

Programmable logic devices (PLDS) are a well-known type of digital integrated circuit that can be programmed to perform specified logic functions. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLS, RAM, and so forth).

The CLBs, IOBs, interconnect, and other logic blocks are typically programmed by loading a stream of configuration data into internal configuration memory cells that define how the logic blocks and interconnect are configured. The configuration data can be read from memory (e.g., an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by configuration data bits provided to the device for that purpose. The data bits can be stored in volatile memory (e.g., static RAM cells, as in FPGAs and some CPLDs), in non-volatile memory (e.g., FLASH memory, as in some CPLDS), or in any other type of memory cell. Programmable devices can also be implemented in other ways, e.g., using fuse or antifuse technology. However, for the purposes of the present specification, the term "PLD" is used to describe a re-programmable programmable logic device, e.g., an FPGA, CPLD, or other re-programmable device.

As PLD designs increase in complexity, they reach a point at which the designer cannot deal with the entire design at the gate level. Where once a typical PLD design comprised perhaps 5,000 gates, PLD designs with over 100,000 gates are now common. To deal with this complexity, circuits are typically partitioned into smaller circuits that are more easily handled. Often, these smaller circuits are divided into yet smaller circuits, imposing on the design a multi-level hierarchy of logical blocks.

Libraries of pre-developed blocks of logic ("cores" or "macros") have been developed that can be included in a PLD design. Such cores can include, for example, adders, multipliers, filters, and other arithmetic and DSP functions from which complex designs can be readily constructed. The use of pre-developed cores permits faster design cycles, by eliminating the redesign of duplicated circuits. Further, the library cores provided by PLD vendors or associated core providers are typically well tested, thereby making it easier to develop a reliable complex design.

Techniques such as the provision of cores are helpful in resolving some of the design issues facing system designers, such as time-to-market and product reliability. However, additional issues remain.

One issue that can sometimes be a design challenge is the provision for alterations in a design at a future time. For example, design changes can be necessitated by errors in the original design that are discovered after a product is placed into production. As another example, desired improvements to the product can be made over time, e.g., in future revisions of the product. PLDs are well suited for use in such systems due to the re-programmable nature of the PLDs. When a design change is desired, a designer can alter the original design, generate new configuration data for the altered design, and provide the new configuration data to the PLD, often while the PLD is still present in the system. Such changes can even be made remotely in some cases, e.g., over the Internet. To allow for such design changes, it is not uncommon for a designer to leave some "extra room" (i.e., unused programmable resources) in a PLD design.

However, when additional logic is added to an existing design, sometimes the new design does not function properly due to the additional noise generated by the additional logic. Time-consuming debug and redesign can be required to produce a properly functioning new design. Even when the new design appears to function properly, a designer typically does not assume that the original functionality is unaffected by the additional noise. Therefore, the designer typically re-qualifies the design by performing a series of tests designed to verify not only the new functionality, but also the original functionality that should not have been affected by the additional logic.

Therefore, it is desirable to provide methods that enable the revision of an existing PLD design and/or the addition of new logic to an existing PLD design without introducing additional noise that can adversely affect the existing design.

SUMMARY OF THE INVENTION

The invention provides design and test methods that make use of "noise cores" for a PLD. "Noise cores" are pre-developed blocks of logic included in a PLD design for the purpose of creating noise in other circuits implemented in the PLD together with the noise core. (The term "noise" as used herein can include, for example, any of the following phenomena, or any combination thereof: switching noise, heat, ground bounce, and jitter.) The noise core can be, for example, a number of flip-flops arranged as a shift register, a counter, a series of toggle flip-flops, and so forth, and can optionally include one or more output pads. In some embodiments, the noise core can be enabled (e.g., for testing) and disabled (e.g., for inclusion in a system). In some embodiments, the noise core includes a clock input terminal, which can be coupled to an input/output (I/O) pad of the PLD or to a clock output terminal of the user circuit.

The noise core is included in an implemented PLD design along with a user circuit. By gradually increasing the level of noise created by the noise core, the noise sensitivity of the user circuit can be determined, and the user circuit can be modified as necessary to decrease the noise sensitivity. Also, by ensuring that the user circuit functions properly when combined with the noise core, a designer can have confidence that unmodified portions of the user circuit will still function properly when changes and/or additions are made to the user circuit.

In some embodiments, once the user circuit has been qualified (tested for desired functionality) with the noise core operating, the noise core is disabled for inclusion in a system. Because it has already been determined that the user circuit can withstand a certain level of noise, future additions to the design do not necessarily require that the user circuit be re-qualified.

According to a first aspect of the invention, a method of designing for future modification of a user circuit in a PLD includes: specifying the user circuit for implementation in the PLD; specifying a noise core for implementation in the PLD, the noise core being designed to create noise in other circuits implemented together with the noise core; and implementing the user circuit and the noise core together in the PLD, thereby creating a PLD design. Some embodiments include the further steps of qualifying the user circuit to perform required functions using the PLD design, and including the PLD design in a system after qualifying the user circuit.

In some embodiments, the noise core includes an enable feature. In these embodiments, the user circuit is qualified with the noise core enabled, and the noise core is disabled when the PLD design is included in the system. For example, the noise core can be enabled and disabled using a signal applied to an input/output (I/O) terminal of the PLD. In other embodiments, the noise core is enabled and disabled using at least one memory cell in the PLD. Some such embodiments include selecting an enable value for the noise core prior to implementing the user circuit and the noise core together in the PLD, and selecting a disable value for the noise core and re-implementing the user circuit and the noise core together in the PLD prior to including the PLD design in the system.

In some embodiments, after including the PLD design in a system, the user circuit is modified and re-implemented in the PLD together with the noise core. The resulting modified design is then used to replace the original PLD design in the system, without re-qualifying the user circuit.

According to a second aspect of the invention, a method of testing required functions in a user circuit implemented in a PLD includes: specifying the user circuit for implementation in the PLD; specifying a noise core for implementation in the PLD, the noise core being designed to create noise in other circuits implemented together with the noise core; implementing the user circuit and the noise core together in the PLD, thereby creating a PLD design; setting an activity level in the noise core; testing the user circuit using the PLD design with the noise core active at the set activity level; and repeating the setting and testing until a failure activity level is determined.

In some embodiments, repeating the setting and testing comprises gradually increasing the activity level of the noise core until the user circuit fails the testing.

In some embodiments, the method also includes: modifying the user circuit in response to the testing in an effort to increase the failure activity level; re-implementing the user circuit and the noise core together in the PLD, thereby creating a modified design; and repeating the setting and testing until a modified failure activity level is determined.

In some embodiments, the noise core includes an enable feature. In these embodiments, the user circuit is tested with the noise core enabled, and the noise core is disabled after the failure activity level is determined. For example, the noise core can be enabled and disabled using a signal applied to an I/O terminal of the PLD. In other embodiments, the noise core is enabled and disabled using at least one memory cell in the PLD. Some such embodiments include selecting an enable value for the noise core prior to implementing the user circuit and the noise core together in the PLD, and selecting a disable value for the noise core and re-implementing the user circuit and the noise core together in the PLD after the failure activity level is determined.

In some embodiments, the noise core includes a clock input terminal, which can be coupled to an I/O pad of the PLD or to a clock output terminal of the user circuit.

BRIEF DESCRIPTION OF THE DRAWINGS

The present invention is illustrated by way of example, and not by way of limitation, in the following figures.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 1:
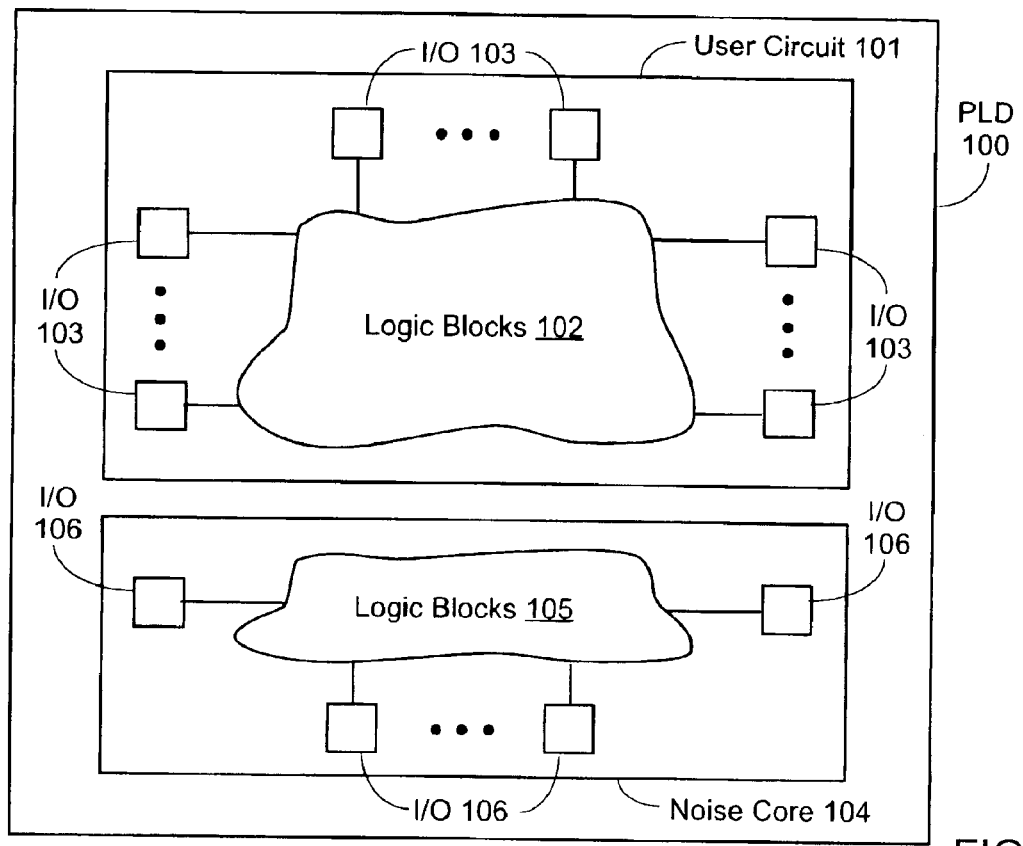
FIG. 1 is a block diagram of a programmable logic device (PLD) in which a user circuit and a noise core are implemented in a first exemplary configuration.

FIG. 1 shows a PLD 100 in which a noise core 104 is implemented along with a user circuit 101. User circuit 101 typically includes a number of logic blocks 102 and several input/output (I/O) blocks 103. Noise core 104 also includes one or more logic blocks 105 and accompanying I/O pad(s) 106.

The user circuit and the noise core can be implemented in separate areas of the PLD, as shown in FIG. 1. However, if modifications are later made to the user circuit, the modifications might be made to logic embedded in the interior of the user circuit. Therefore, to emulate the noise level that might be created by later additions or changes to the circuit, it can be preferable to implement the noise core within the user circuit, as shown in FIG. 2, or even entirely surrounded by or interleaved with the user circuit.

Figure 2:
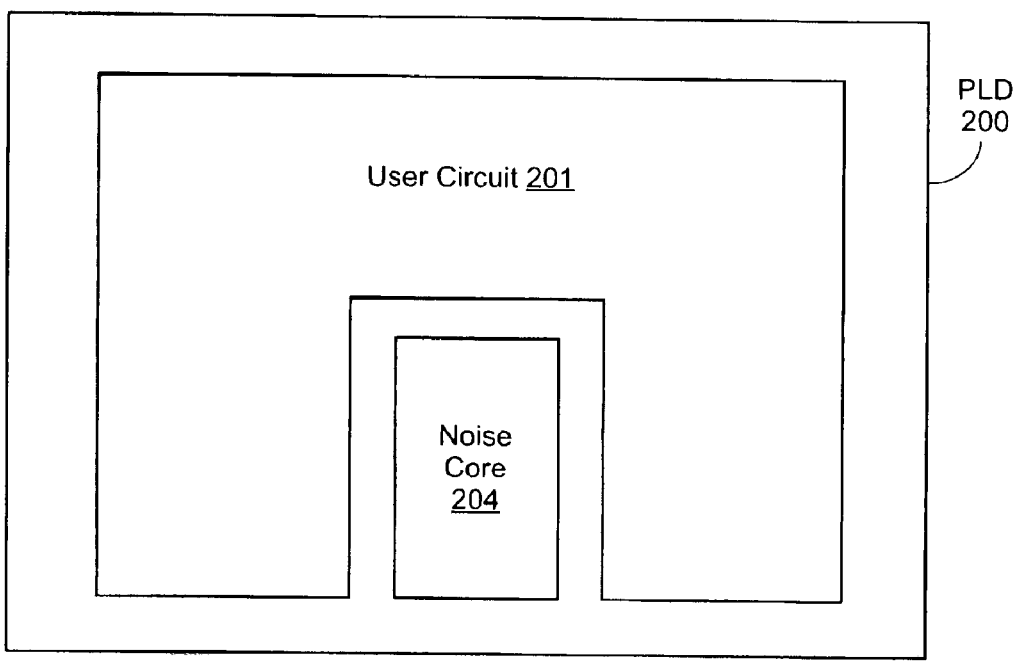
FIG. 2 is a block diagram of a PLD in which a user circuit and a noise core are implemented in a second exemplary configuration.

In FIG. 2, PLD 200 includes a noise core 204 that is surrounded on three sides by user circuit 201. The fourth side of noise core 204 abuts the edge of the PLD, to take advantage of the I/O resources positioned in that area.

However, the noise core and the user circuit can have any shapes and orientations to each other.

Noise cores can be implemented using any user-programmable logic available in the PLD. For example, in an FPGA that includes configurable logic blocks (CLBs) and programmable input/output blocks (IOBs), any of the user-programmable logic elements can be used. For example, in a CLB, the lookup table structures (LUTs) can be used, or the carry chains, or the memory elements, and so forth, and any combination of these elements. LUTs can be utilized in any of the available modes, e.g., lookup table mode, RAM mode, or shift register mode. Similarly, an IOB typically includes many programmable structures in addition to the I/O pad, such as input and output flip-flops. These structures can also be used to implement a noise core. Even the programmable interconnect structure can be used. Generally speaking, it is desirable to include in the noise core whatever programmable resources are likely to be utilized when additions or changes to the user circuit are made at a later time. When this approach is followed, the noise core most closely mimics the noise level likely to be produced by the modified user circuit.

Figure 3:
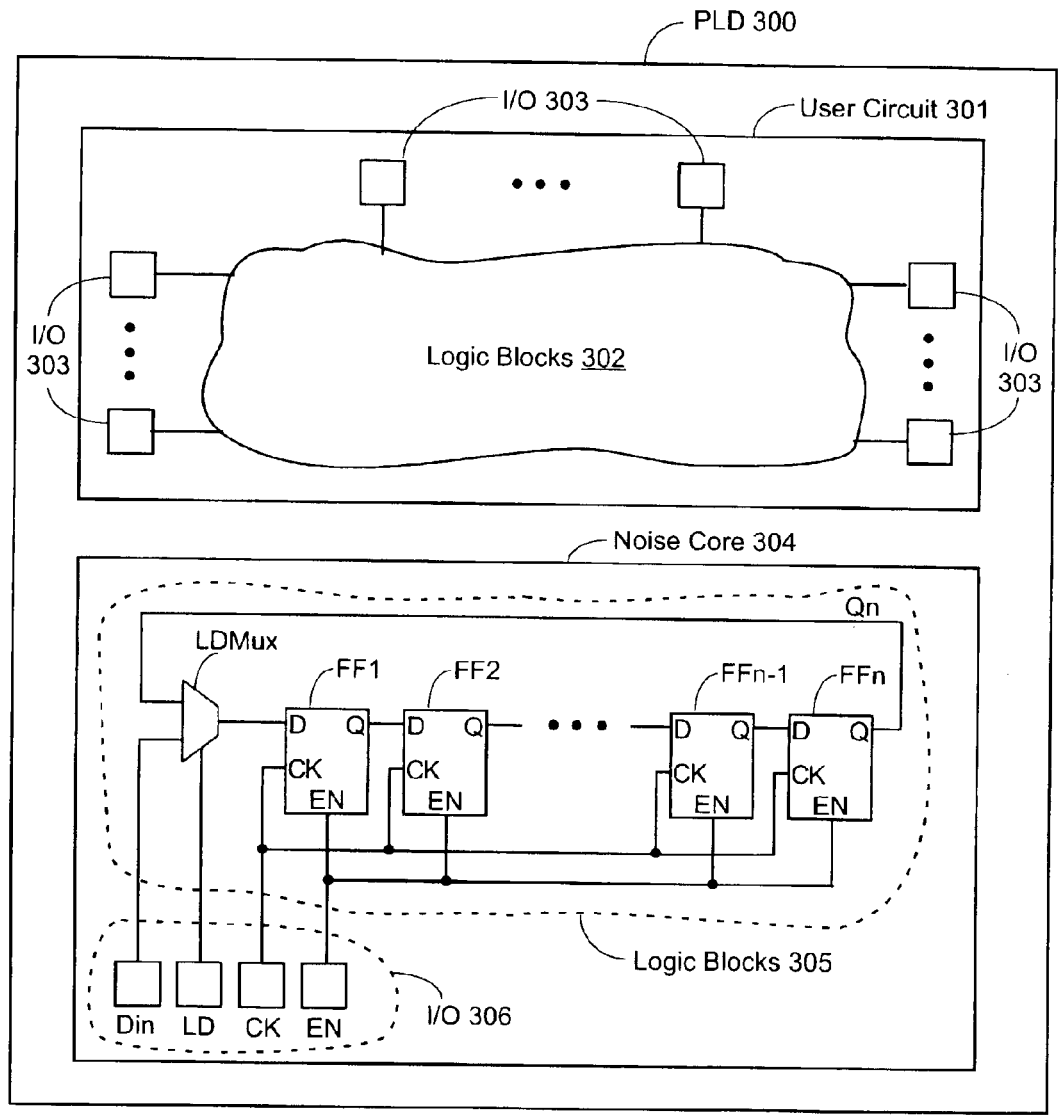
FIG. 3 is a PLD in which a first implementation of a noise core is included in a PLD along with a user circuit.

FIG. 3 shows a PLD 300 that includes a user circuit 301 and a noise core 304 having an exemplary implementation according to one embodiment of the invention. Noise core 304 includes a series of flip-flops FF1-FFn coupled in series to form an n-bit shift register. (In one embodiment, the value of "n" is 8, but the value of "n" can be selected, for example, to use most or all of the flip-flops in the PLD that are not used in implementing the user circuit 301.) The output signal Qn from flip-flop FFn is optionally fed back to the data input D of flip-flop FF1 through multiplexer LDMux. (In the present specification, the same reference characters are used to refer to I/O pads, terminals, signal lines, and their corresponding signals.)

Multiplexer LDMux is controlled by a multiplexer load signal LD, which in the pictured embodiment is supplied by one of the I/O pads 306 of PLD 300. Multiplexer LDMux can also be used to shift a value into the shift register via I/O pad Din. The operation of the shift register is then controlled by a clock input signal CK and an enable signal EN. In the pictured embodiment, both clock input signal CK and enable signal EN are supplied from off-chip using I/O pads 306.

The number of bits changing state in the shift register can be controlled by loading various patterns into the shift register. The maximum amount of switching activity (and therefore the maximum amount of noise) is generated by loading a pattern of alternating ones and zeros (high and low values). In this example, the value in each flip-flop changes on every active clock edge (assuming the shift register is enabled). By increasing or decreasing the number of bits between alternating values, the activity level of the noise core can be altered.

In another embodiment (not shown), the output Q of each flip-flop (or of a subset of the flip-flops) drives an I/O pad 306. Because switching I/O values typically generate large amounts of noise, it can be desirable to include in the noise core the maximum number of I/O pads that might possibly be added to the user circuit during future system revisions.

In the embodiment of FIG. 3, all of the control signals for the noise core are supplied from off-chip via I/O pads 306. However, this need not necessarily be the case. For example, FIG. 4 shows an embodiment otherwise similar to the embodiment of FIG. 3 where some of the control signals for the noise core are supplied by other sources.

Figure 4:
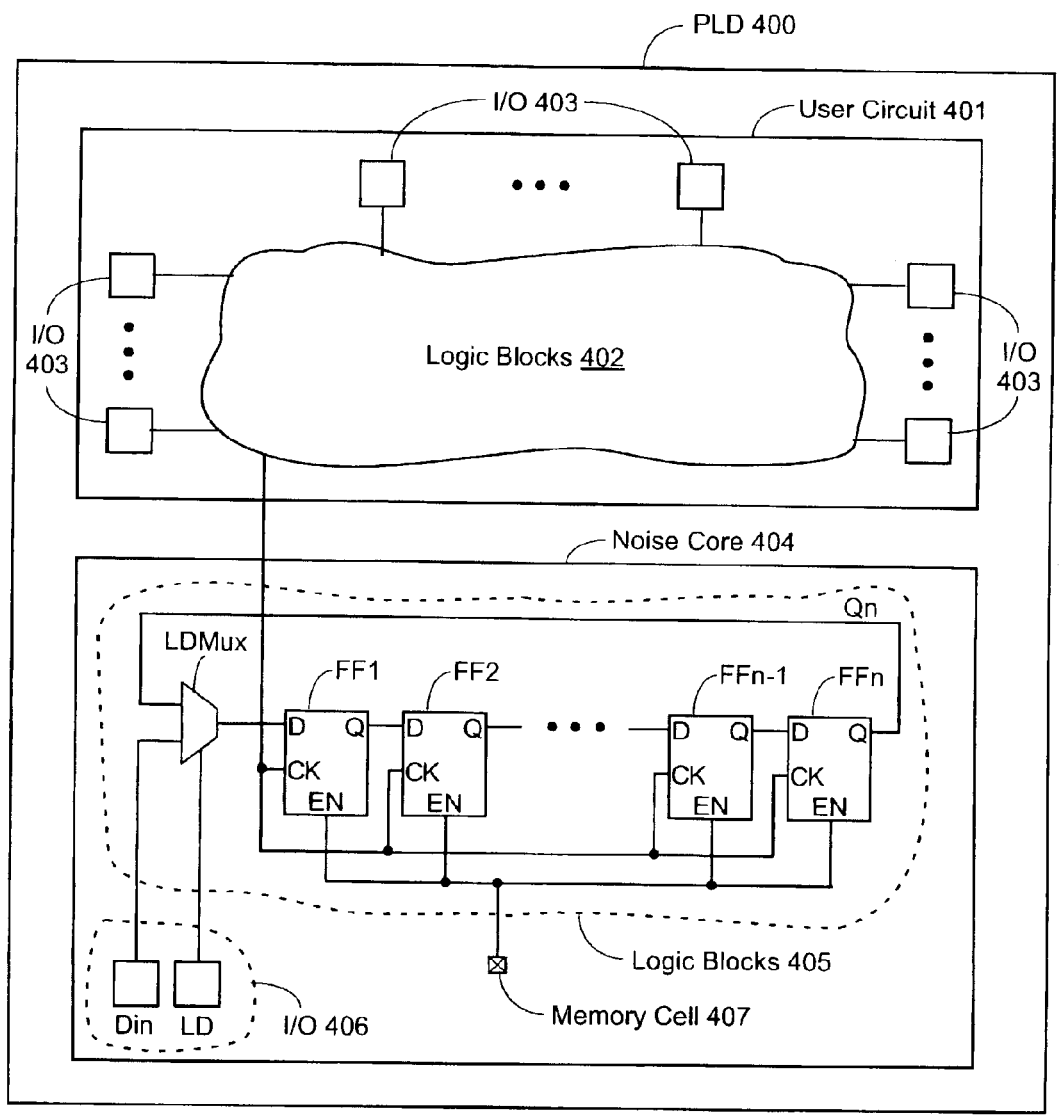
FIG. 4 is a PLD in which a second implementation of a noise core is included in a PLD along with a user circuit.

In FIG. 4, PLD 400 includes a user circuit 401 and a noise core 404. Noise core 404 includes a shift register similar to that of noise core 304 of FIG. 3. However, in noise core 404, the clock signal CK is supplied by user circuit 401. It can be desirable to supply clock signal CK from user circuit 401, because if in the future new logic is added to user circuit 401, the new logic would probably use the same clock signal and the same clock network as logic blocks 402.

Also in noise core 404, the enable signal EN is not supplied from off-chip. Instead, enable signal EN is supplied by a configuration memory cell 407 of the PLD. In PLDs lacking individually re-configurable memory cells, the value of EN is determined at the time the PLD is configured with the user circuit and the noise core, and cannot be changed without re-configuring the entire PLD. Thus, in these embodiments the device is preferably configured with the noise core enabled for the testing process, and the entire device is re-configured with the noise core disabled when the PLD design is to be used in a system.

Clearly, noise core 304 need not include a shift register. A shift register provides a convenient method of controlling the activity level of the noise core, but other types of circuits can be used. For example, the noise core can include a plurality of toggle flip-flops coupled in series, with the activity level controlled by a series of enable signals each coupled to one or more of the toggle flip-flops. In some embodiments, the noise core includes a counter, which in some embodiments can be programmed (e.g., using configuration memory cells) to count using a predetermined number of bits. Other embodiments use other circuits to generate the desired noise. In some embodiments, the noise core is deliberately implemented in such a fashion as to mimic the type of logic and the level of activity and noise expected to be generated by projected revisions and/or additions to the user circuit.

Figure 5:
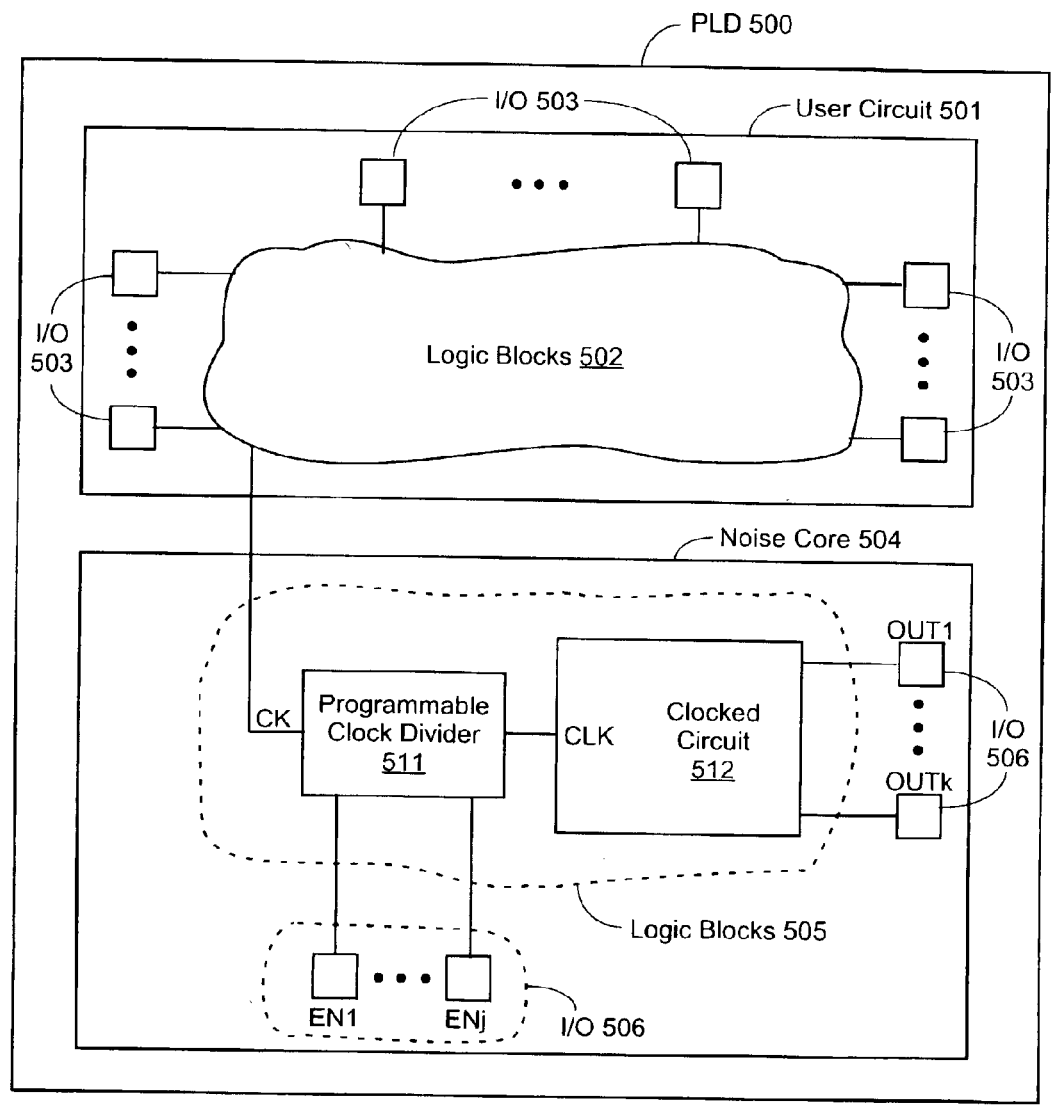
FIG. 5 is a PLD in which a third implementation of a noise core is included in a PLD along with a user circuit.

FIG. 5 illustrates another way of controlling the activity level of a noise core. In the embodiment of FIG. 5, external enable signals are used to regulate the frequency of the clock signal used by the circuit. PLD 500 includes a user circuit 501 and a noise core 504. Noise core 504 includes a clocked circuit 512, which can be, for example, a shift register, a counter, a series of toggle flip-flops, or any other digital circuit. The clock signal CLK for clock circuit 512 is provided by a programmable clock divider 511, which is driven by a clock signal CK. Clock signal CK can be provided by user circuit 501, as shown. Alternatively, clock signal CK can be provided from off-chip using an I/O pad, or can be generated within noise core 504 using an oscillator circuit designed into the noise core.

The enable signals EN1-ENj controlling programmable clock divider 511 can be provided from off-chip, as shown, by configuration memory cells, or by user circuit 501. Enable signals EN1-ENj control the clock frequency at which clocked circuit 512 operates, and thus control the activity level of noise core 504.

In some embodiments, programmable clock divider 511 is implemented using a programmable dedicated clock circuit such as the Digital Clock Manager (DCM) circuit included in many of the FPGAs offered by Xilinx, Inc. In other embodiments, programmable clock divider 511 is implemented using the general programmable logic resources such as CLBs.

In other embodiments (not shown), programmable clock divider 511 is replaced by a programmable clock multiplier or a programmable clock multiplier/divider.

Figure 6:
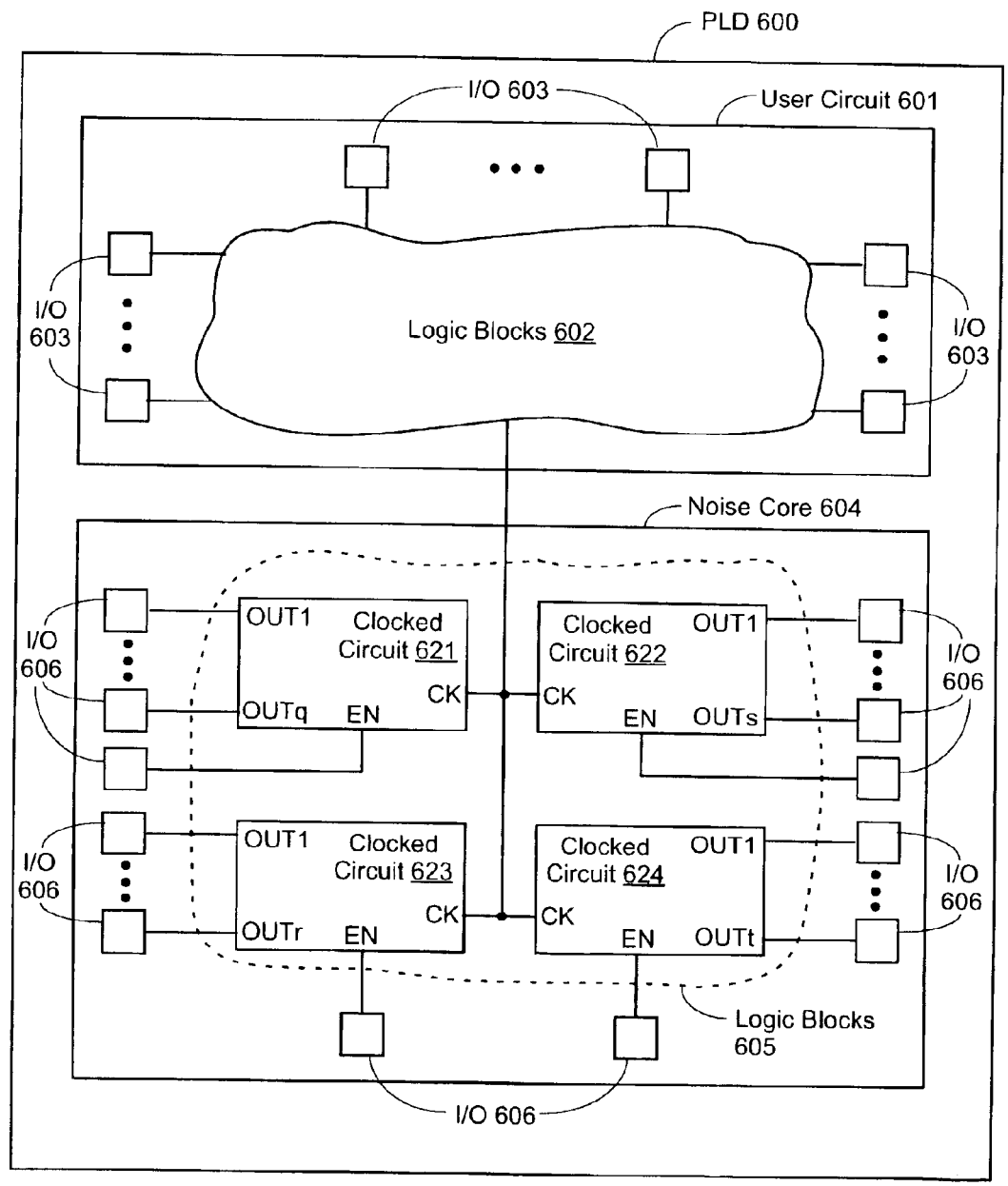
FIG. 6 is a PLD in which a fourth implementation of a noise core is included in a PLD along with a user circuit.

If at a later time the designer wants to add more logic to the user circuit, it might be necessary to reduce the size of the noise core to provide the necessary programmable resources. Another reason it can be desirable to reduce the size of the noise core is because the enlarged user circuit will itself be generating more noise. Reducing the size of the noise core can be a simpler undertaking if several smaller clocked circuits are used, as shown in FIG. 6. When several smaller clocked circuits are used, the size of the noise core can be reduced by simply removing one or more of the smaller clocked circuits.

FIG. 6 shows a PLD 600 that includes a user circuit 601 and a noise core 604 made up of four smaller clocked circuits 621–624. (In other embodiments, other numbers of clocked circuits are used.) Clocked circuits 621–624 can be the same, or can be different from each other. When clock circuits 621–624 are the same, controlling the circuits via I/O pads 606 is simplified, because, for example, all of the enable signals EN can be controlled by a single signal from the tester.

Note that in the embodiment of FIG. 6, each noise core includes one or more output pads (OUT1–OUTx). These output pads can be included, for example, to mimic the noise effect of several I/O pads switching simultaneously to a new value. For example, when the PLD is an FPGA, the output pads are implemented using the Input/Output Blocks (IOBs) of the FPGA. Also included in the noise core can be other elements also included in the IOBs, such as input and output flip-flops.

Figure 7:
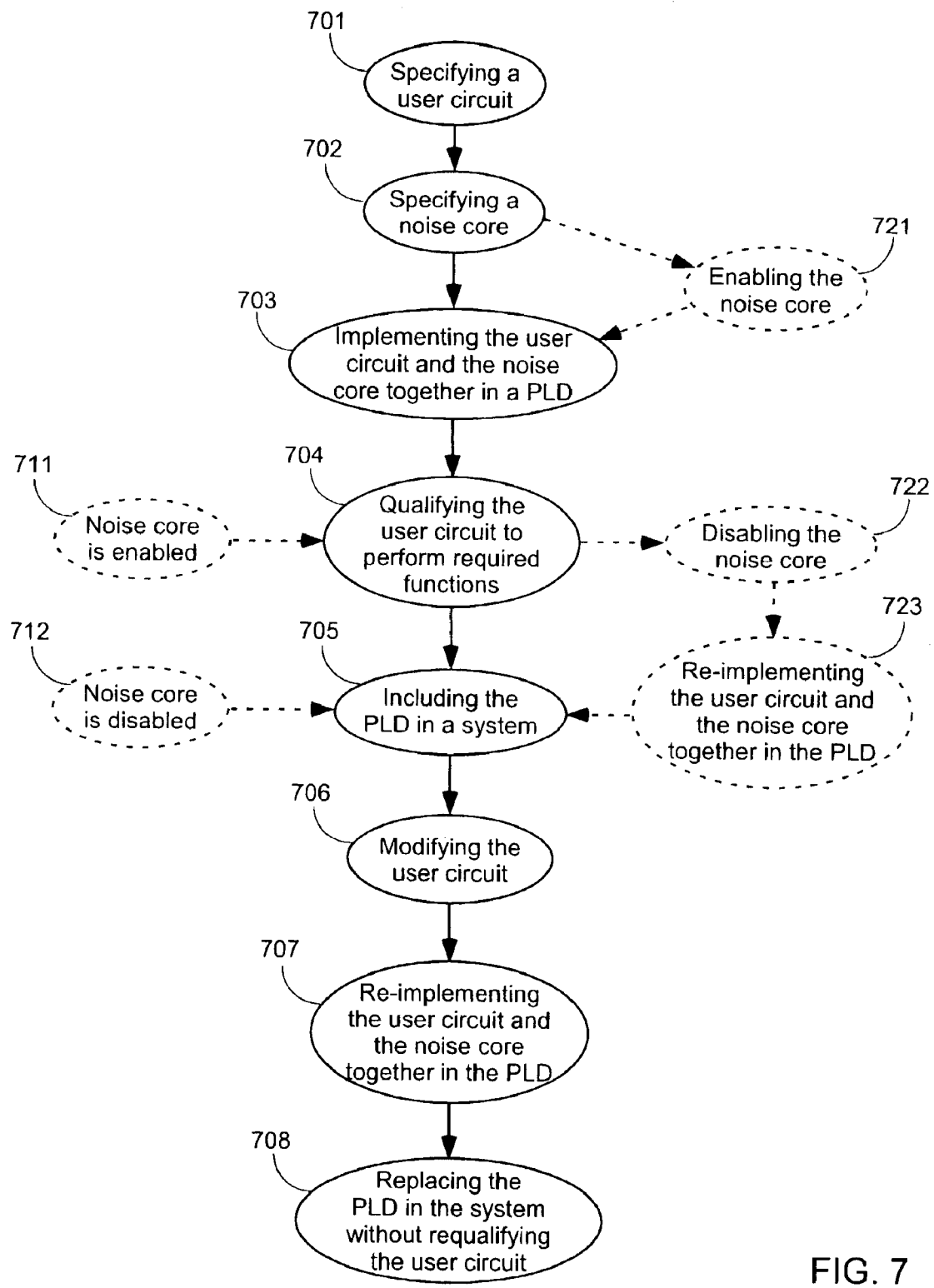
FIG. 7 illustrates the steps of an exemplary method of using a noise core to design for future modification of a user circuit in a PLD.

FIG. 7 illustrates a method of using a noise core to design for future modification of a user circuit in a PLD. In step 701, a user circuit is specified for implementation in a PLD design. In step 702, a noise core is specified for implementation with the user circuit in the PLD design. The noise core can be, for example, a library core supplied by the PLD provider, such as those described above in conjunction with FIGS. 3–6. The type of noise core used can depend, for example, on what type of modifications are likely to be included in future revisions of the user circuit and how much noise these revisions are expected to generate. Steps 701 and 702 can be implemented in any order.

In step 703, the user circuit and the noise core are implemented together in the PLD. For example, where the PLD is an FPGA, the FPGA implementation software can map, place, and route the specified circuits to provide a PLD design in the form of a configuration data file.

In step 704, the PLD design is tested to confirm the required functionality of the user circuit. This process is called "qualifying" the user circuit. Qualifying a circuit typically involves testing at various temperatures, voltage levels, and clock frequencies to ensure that the user circuit as implemented in the PLD can perform the required functions for the user circuit. In step 705, after qualifying the user circuit, the PLD design is included in a system, e.g., in a product that will be shipped to customers.

In some embodiments, the noise core includes an enable feature. In these embodiments, the noise core is enabled when qualifying the user circuit, and disabled when the PLD design is included in the system. In some embodiments, the noise core is enabled and disabled using a signal applied to an I/O pad, as in the embodiment of FIG. 3, for example. In these embodiments, the noise core is enabled (711) during qualification (step 704), and disabled (712) when the PLD design is in the system (step 705).

In some embodiments, the noise core is enabled and disabled using one or more memory cells in the PLD. In some of these embodiments, the noise core is enabled by selecting an enable value for the noise core (step 721) prior to implementing the user circuit and the noise core together in the PLD (step 703). This is necessary in some PLDs because in these PLDs the value of the enable signal is implemented as part of the PLD design. After the user circuit has been qualified (step 704), the noise core is disabled by selecting a disable value for the noise core (step 722) and re-implementing the user circuit and the noise core together in the PLD (step 723). The re-implemented design is then included in the system (step 705). In other PLDs, the value in the memory cell can be selectively changed to enable and disable the noise core without re-implementing the design.

The noise core is preferably disabled for inclusion in the system, rather than simply removing the noise core from the design and re-implementing the user circuit without the noise core. Re-implementing the user circuit without the presence of the noise core could change the timing of the user circuit enough to require re-qualification of the design. Instead, the noise core can be disabled and, if desired, the implementation software can be told to reimplement the PLD design without altering the existing placement and routing of unchanged logic. This capability is well-known and available in commercial PLD implementation software, e.g., in the FPGA implementation software available from Xilinx, Inc.

Figure 8:
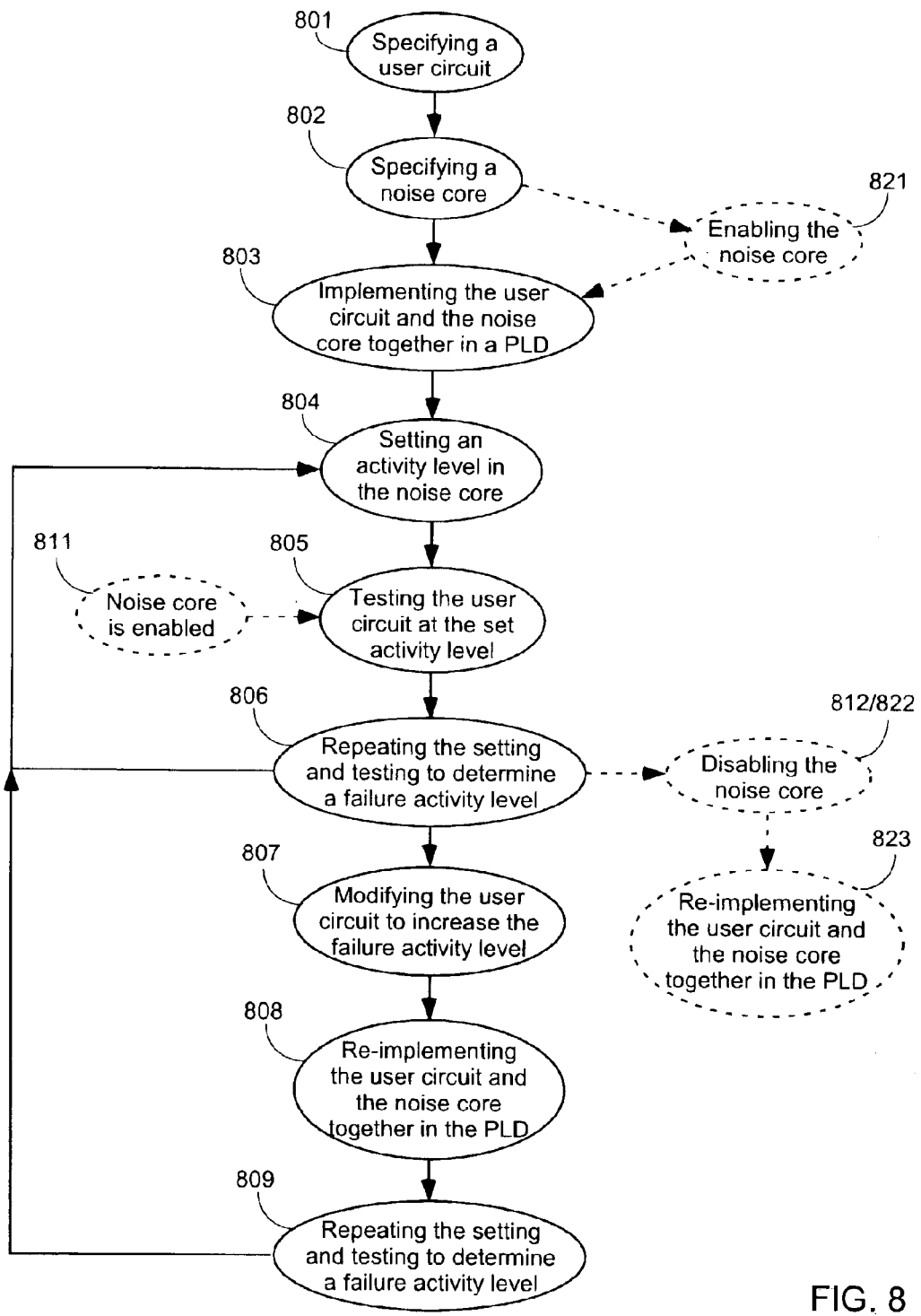
FIG. 8 illustrates the steps of an exemplary method of using a noise core to test required functions in a user circuit implemented in a PLD.

FIG. 8 illustrates the steps of an exemplary method of using a noise core to test required functions in a user circuit implemented in a PLD. For example, by gradually increasing the level of noise created by the noise core, the noise sensitivity of the user circuit can be determined, and the user circuit can be modified as necessary to reduce its noise sensitivity.

In step 801, a user circuit is specified for implementation in a PLD design. In step 802, a noise core is specified for implementation in the PLD design with the user circuit. The noise core can be, for example, a library core supplied by the PLD provider, such as those described above in conjunction with FIGS. 3–6. The type of noise core used can depend, for example, on what type of modifications are likely to be included in future revisions of the user circuit and how much noise these revisions are expected to generate. Steps 801 and 802 can be implemented in any order.

In step 803, the user circuit and the noise core are implemented together in the PLD. For example, where the PLD is an FPGA, the FPGA implementation software can map, place, and route the specified circuits to provide a PLD design in the form of a configuration data file.

In step 804, an activity level is set for the noise core. For example, in the embodiment of FIG. 3, the activity level is set by loading a value into the shift register having a predetermined number and distribution of transitions between high and low values. In the embodiment of FIG. 5, a divisor value for the programmable clock divider is selected using the enable signals, and so forth. Many different schemes can be used for setting the activity level of the noise core, and all such schemes are encompassed by the present invention.

In step 805, the PLD design is tested to confirm the required functionality of the user circuit at the activity level set in step 804. In step 806, the setting and testing steps (steps 804 and 805) are repeated until a failure activity level has been determined. For example, the activity level can be gradually raised until the user circuit fails the tests.

After the failure activity level has been determined, the designer might choose to modify the user circuit (step 807) to increase the failure activity level. In some embodiments, the noise core is also modified. For example, when the size of the user circuit is increased, the noise core can be reduced in size to release the programmable PLD resources needed for the new logic in the user circuit. After modifying the user circuit, in step 808 the user circuit and the noise core are re-implemented together in the PLD. In step 809, the setting and testing steps (steps 804 and 805) are again repeated until a failure activity level has been determined.

In some embodiments, the noise core includes an enable feature. In these embodiments, the noise core is enabled when testing the user circuit, and disabled after the failure activity level has been determined. In some embodiments, the noise core is enabled and disabled using a signal applied to an I/O pad, as in the embodiment of FIG. 3, for example. In these embodiments, the noise core is enabled (811) during testing (step 805), and disabled (812) after the failure activity level has been determined (step 806).

In some embodiments, the noise core is enabled and disabled using one or more memory cells in the PLD. In some of these embodiments, the noise core is enabled by selecting an enable value for the noise core (step 821) prior to implementing the user circuit and the noise core together in the PLD (step 803). This is necessary in some PLDs because in these PLDs the value of the enable signal is implemented as part of the PLD design. After the failure activity level has been determined (step 806), the noise core is disabled by selecting a disable value for the noise core (step 822) and re-implementing the user circuit and the noise core together in the PLD (step 823). In other PLDs, the value in the memory cell can be selectively changed to enable and disable the noise core without re-implementing the design.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the methods of the invention in the context of PLDs such as field programmable gate arrays (FPGAs). However, the methods of the invention can also be implemented in other re-programmable logic devices, including but not limited to CPLDs.

Further, PLDs, noise cores, user circuits, flip-flops, clock divider circuits, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Accordingly, all such modifications and additions are deemed to be within the scope of the invention, which is to be limited only by the appended claims and their equivalents.

What is claimed is:

1. A method of designing for future modification of a user circuit in a programmable logic device (PLD), comprising:
   specifying the user circuit for implementation in the PLD;
   specifying a noise core for implementation in the PLD, the noise core being designed to create noise in other circuits implemented together with the noise core;
   implementing the user circuit and the noise core together in the PLD, thereby creating a PLD design;
   qualifying the user circuit to perform required functions using the PLD design; and
   including the PLD design in a system after qualifying the user circuit.

2. The method of claim 1, wherein:
   the noise core includes an enable feature;
   qualifying the user circuit comprises qualifying the user circuit with the noise core enabled; and
   the noise core is disabled when the PLD design is included in the system.

3. The method of claim 2, wherein the noise core is enabled and disabled using a signal applied to an input/output (I/O) terminal of the PLD.

4. The method of claim 2, wherein the noise core is enabled and disabled using at least one memory cell in the PLD, the method further comprising:
   selecting an enable value for the noise core prior to implementing the user circuit and the noise core together in the PLD; and
   selecting a disable value for the noise core and re-implementing the user circuit and the noise core together in the PLD prior to including the PLD design in the system.

5. The method of claim 1, further comprising:
   modifying the user circuit after including the PLD design in a system;
   re-implementing the user circuit and the noise core together in the PLD, thereby creating a modified design; and
   replacing the PLD design with the modified design in the system without re-qualifying the user circuit.

6. The method of claim 5, wherein modifying the user circuit comprises adding additional circuitry.

7. The method of claim 6, further comprising:
   modifying the noise core to reduce the size of the noise core prior to re-implementing the user circuit and the noise core together in the PLD.

8. The method of claim 1, wherein the noise core creates at least one of the following phenomena in the user circuit: switching noise, heat, ground bounce, and jitter.

9. The method of claim 1, wherein the noise core comprises a clock input terminal coupled to an input/output (I/O) pad of the PLD.

10. The method of claim 1, wherein the noise core comprises a clock input terminal coupled to a clock output terminal of the user circuit.

11. The method of claim 1, wherein the noise core comprises at least one of the following circuits: a shift register, a plurality of toggle flip-flops coupled in series, a counter, and an output pad.

12. The method of claim 1, wherein the PLD comprises one of the following: a field programmable gate array (FPGA) and a Complex Programmable Logic Device (CPLD).

13. A method of testing required functions in a user circuit implemented in a programmable logic device (PLD), comprising:

specifying the user circuit for implementation in the PLD;

specifying a noise core for implementation in the PLD, the noise core being designed to create noise in other circuits implemented together with the noise core;

implementing the user circuit and the noise core together in the PLD, thereby creating a PLD design;

setting a noise level in the noise core;

testing the user circuit using the PLD design with the noise core generating noise at the set noise level; and repeating the setting and testing until a failure activity level is determined.

14. The method of claim 13, wherein repeating the setting and testing comprises gradually increasing the noise level of the noise core until the user circuit fails the testing.

15. The method of claim 13, further comprising:

modifying the user circuit in response to the testing in an effort to increase the failure activity level;

re-implementing the user circuit and the noise core together in the PLD, thereby creating a modified design; and repeating the setting and testing until a modified failure activity level is determined.

16. The method of claim 13, wherein:

the noise core includes an enable feature;

testing the user circuit comprises testing the user circuit with the noise core enabled; and the method further comprises disabling the noise core after the failure activity level is determined.

17. The method of claim 16, wherein the noise core is enabled and disabled using a signal applied to an input/output (I/O) terminal of the PLD.

18. The method of claim 16, wherein the noise core is enabled and disabled using at least one memory cell in the PLD, the method further comprising:

selecting an enable value for the noise core prior to implementing the user circuit and the noise core together in the PLD; and selecting a disable value for the noise core and re-implementing the user circuit and the noise core together in the PLD after the failure activity level is determined.

19. The method of claim 13, wherein the noise core creates at least one of the following phenomena in the user circuit: switching noise, heat, ground bounce, and jitter.

20. The method of claim 13, wherein the noise core comprises a clock input terminal coupled to an input/output (I/O) pad of the PLD.

21. The method of claim 13, wherein the noise core comprises a clock input terminal coupled to a clock output terminal of the user circuit.

22. The method of claim 13, wherein the noise core comprises at least one of the following circuits: a shift register, a plurality of toggle flip-flops coupled in series, a counter, and an output pad.

23. The method of claim 13, wherein the PLD comprises one of the following: a field programmable gate array (FPGA) and a Complex Programmable Logic Device (CPLD).

24. A method of testing a circuit design, comprising:

creating a combined circuit specification including a user design and a noise core, wherein the user design specifies a set of functions of the circuit design, and the noise core defines a noise circuit that generates noise on a PLD during testing of the functions of the circuit design on the PLD, and the noise circuit implemented by the noise core being controllable to generate a plurality of noise levels;

generating configuration data from the combined circuit specification, wherein the configuration data implements combined circuit specification on the PLD; and controlling the noise level generated by the noise circuit while testing the set of functions of the circuit design implemented on the PLD.

25. The method of claim 24, further comprising:

selecting a current noise level;

controlling the noise circuit to generate noise at the current noise level;

responsive to determining positive test results from testing the set of functions, selecting a new current noise level greater than the current noise level;

repeating the controlling the noise circuit and selecting a new current noise level; and responsive to determining negative test results from testing the set of functions, ceasing the controlling of the noise circuit and testing of the set of functions.

26. The method of claim 24, wherein controlling the noise level includes establishing a number of bits in the noise circuit that will alternate values during testing of the circuit.

27. The method of claim 24, wherein creating the combined circuit specification includes specifying the noise core having an n-bit shift register, wherein n is greater than or equal to 8.

28. The method of claim 27, wherein controlling the noise level includes loading a bit pattern into the shift register.

29. The method of claim 24, wherein creating the combined circuit specification includes specifying the noise core having an n toggle-flip-flops coupled in series, wherein n is greater than or equal to 8.

30. The method of claim 24, wherein creating the combined circuit specification includes specifying the noise core having a counter.

31. The method of claim 24, wherein controlling the noise level generated by the noise circuit includes controlling the frequency of a clock signal input to the noise circuit.

32. The method of claim 24, wherein creating the combined circuit specification includes specifying the noise core that defines the noise circuit as generating noise responsive to a first state of an enable signal and generating no noise in response to a second state of the enable signal.

33. The method of claim 32, wherein creating the combined circuit specification includes specifying the noise core that defines the noise circuit being responsive to the enable signal applied to an input/output (I/O) terminal of the PLD.

34. The method of claim 32, wherein creating the combined circuit specification includes specifying the noise core that defines the noise circuit being responsive to the enable signal output from at least one memory cell in the PLD.

35. An apparatus for testing a circuit design, comprising:

means for creating a combined circuit specification including a user design and a noise core, wherein the user design specifies a set of functions of the circuit design, and the noise core defines a noise circuit that generates noise on a PLD during testing of the functions of the circuit design on the PLD, and the noise circuit implemented by the noise core being controllable to generate a plurality of noise levels;

means for generating configuration data from the combined circuit specification, wherein the configuration data implements combined circuit specification on the PLD; and means for controlling the noise level generated by the noise circuit while testing the set of functions of the circuit design implemented on the PLD.

* * * * *